US012603410B2

(12) United States Patent
Aktug et al.

(10) Patent No.: US 12,603,410 B2
(45) Date of Patent: Apr. 14, 2026

(54) HYBRID PLANAR COMBINER FOR PLANAR SOLID STATE POWER AMPLIFIERS

(71) Applicant: ASELSAN ELEKTRONIK SANAYI VE TICARET ANONIM SIRKETI, Ankara (TR)

(72) Inventors: Ahmet Aktug, Ankara (TR); Ridvan Surbahanli, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 37 days.

(21) Appl. No.: 18/525,923

(22) Filed: Dec. 1, 2023

(65) Prior Publication Data

US 2024/0195038 A1 Jun. 13, 2024

(30) Foreign Application Priority Data

Dec. 13, 2022 (TR) ................................ 2022/019205

(51) Int. Cl.
| | |
|---|---|
| *H01P 5/12* | (2006.01) |
| *H03F 1/00* | (2006.01) |
| *H03F 3/21* | (2006.01) |

(52) U.S. Cl.
CPC ................. *H01P 5/12* (2013.01); *H03F 1/00* (2013.01); *H03F 3/211* (2013.01)

(58) Field of Classification Search
CPC ..... H01P 5/12; H01P 5/00; H03F 1/00; H03F 3/211; H03F 3/245; H03F 3/195; H03F 3/213; H03F 3/21; H03F 3/217; H03F 3/2171; H03F 3/26; H03F 3/265; H03F 3/30; H03F 3/3001; H03F 3/3066; H03F 3/3081; H03F 3/3083; H03F 3/24; H03F 3/20; H03F 1/08; H03F 1/083; H03F 1/086

See application file for complete search history.

(56) References Cited

U.S. PATENT DOCUMENTS 5,218,322 A * 6/1993 Allison ................... H03F 3/602
  333/248
7,924,097 B2 4/2011 Lender, Jr. et al.

* cited by examiner

*Primary Examiner* — Jung Kim
(74) *Attorney, Agent, or Firm* — Bayramoglu Law Offices LLC

(57) ABSTRACT

A hybrid planar combiner for use in broadband high power multi-component power amplifier architectures in planar solid-state power amplifiers, which does not comprise impedance converters in the power amplifier layer, is suitable for hermetic construction, supports effective cooling infrastructure and enables easy in-circuit applications.

3 Claims, 1 Drawing Sheet

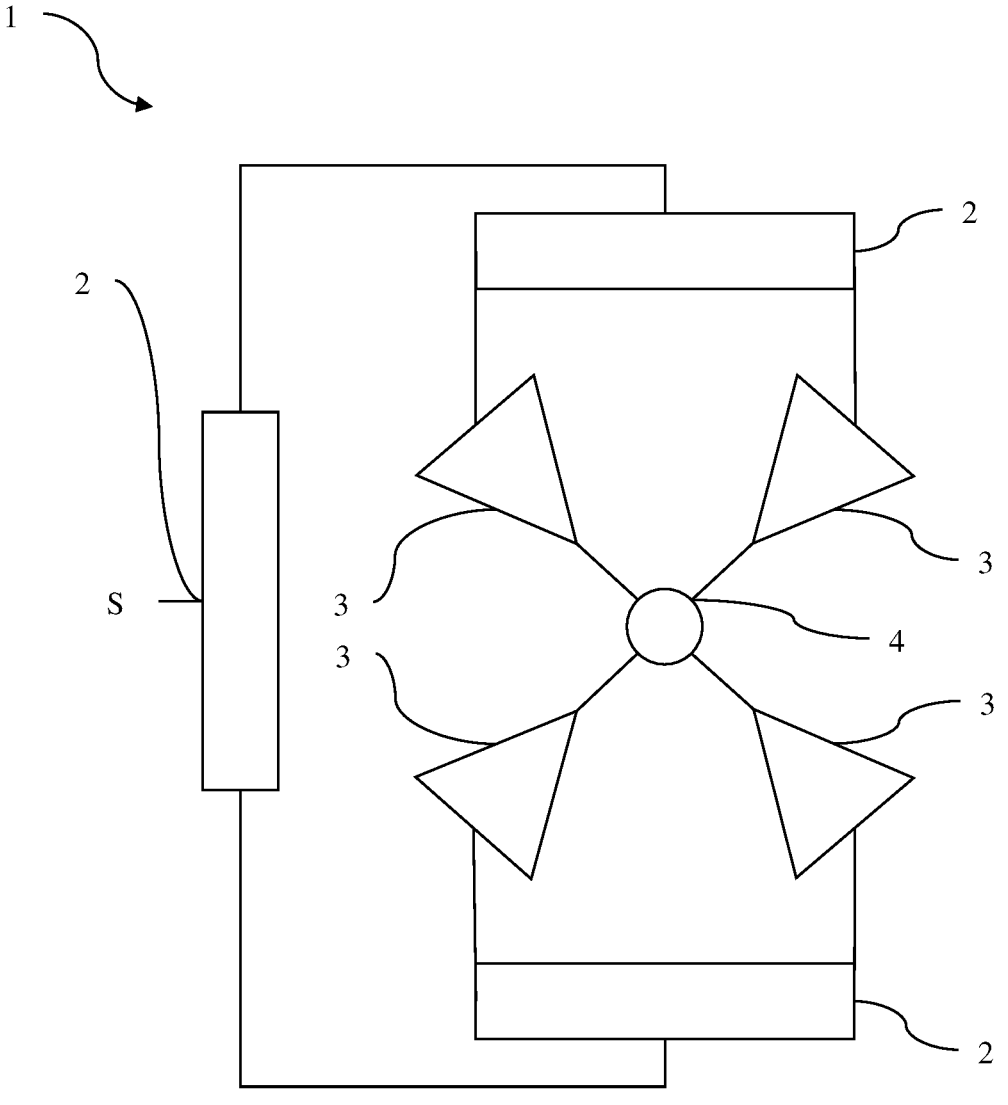

HYBRID PLANAR COMBINER FOR PLANAR SOLID STATE POWER AMPLIFIERS

CROSS REFERENCE TO RELATED APPLICATIONS

This application is based upon and claims foreign priority to Turkey Patent Application No. 2022/019205, filed on Dec. 13, 2022, the entire content of which is incorporated herein by reference.

TECHNICAL FIELD

The invention relates to a hybrid planar combiner for use in broadband high-power multi-component power amplifier architectures in planar solid-state power amplifiers, which does not comprise impedance converters in the power amplifier layer, is suitable for hermetic construction, supports effective cooling infrastructure and enables easy in-circuit applications.

BACKGROUND

Planar solid-state power amplifiers transmit each signal to the planar power amplifiers by dividing the incoming signal power into multiple parts and provide that the amplified signals are combined to ensure that the incoming signal is amplified in semiconductor power amplifiers so that it can be increased to usable power. In the known state of the art, symmetrical Lange couplers, Wilkinson couplers, Coupler couplers are used in the connection of the outputs of the planar power amplifiers, which ensure that the impedance value is kept constant at 50 Ohm, which is the frequently used reference impedance value.

In combiners using impedance transducer coupling, multistage impedance matching techniques are used for impedance changes required in broadband applications under large signal, and these techniques cause high losses in planar structures. Although spatial combining techniques are suitable for combining a large number of power amplifiers, they have the disadvantages of the complexity of the cooling structure, difficulty in manufacturing and repair, and the need for high mechanical precision.

In the United States patent document U.S. Pat. No. 7,924,097, which is in the prior art, an ultra-broadband high-power amplifier constructed with multiple identical ultra-broadband linear amplifiers to be used instead of wave tubes is mentioned. The identical ultra-broadband linear amplifiers in the said power amplifier are connected to each other in such a way as to create only real impedance and can be used with impedance matching.

Therefore, in the prior art, there is a need for a hybrid planar combiner that does not comprise impedance converters in the power amplifier layer, is suitable for hermetic structure, supports effective cooling infrastructure and enables easy in-circuit applications to be used in broadband high power multi-component power amplifier architectures in planar solid state power amplifiers.

SUMMARY

The purpose of the invention is to realize a hybrid planar combiner which does not comprise impedance converters in the power amplifier layer, which is suitable for hermetic structure, supports effective cooling infrastructure and enables easy in-circuit applications to be used in broadband high power multi-component power amplifier architectures in planar solid state power amplifiers.

The hybrid planar combiner of the invention as defined in the first claim and the claims dependent on this claim, which are realized to achieve the purpose of the present invention, comprises at least one signal divider dividing the signal to be amplified, multiple power amplifiers amplifying the signals from the signal divider, and a vertical combiner connecting at one end to the outputs of the power amplifiers and combining the power of the amplified signals, exiting vertically from the surface of the planar solid state power amplifier. By means of the inventive hybrid planar combiner, instead of impedance regulating combining techniques that cause losses during the combining of the amplified signal, the impedance regulation is delegated to the waveguide part and the signal is combined with minimum loss as a result of power amplification. In addition, since impedance regulators are not used in the power amplifier layer by means of the inventive hybrid planar combiner, the thickness of the power amplifiers is kept low, the cooling performance is increased and the processes on the printed circuit board are facilitated.

DETAILED DESCRIPTION OF THE EMBODIMENTS

The hybrid planar combiner realized to achieve the purpose of the invention is shown in the accompanying FIGURE;

FIGURE is a block diagram of the inventive hybrid planar combiner.

The parts in the figures are numbered individually and the equivalents of these numbers are given below.

1. Hybrid planar combiner
2. Signal divider
3. Power amplifier
4. Signal combiner
S: Signal input Planar solid-state power amplifiers (3) for use in broadband high-power multi-component power amplifier (3) architectures include a hybrid planar combiner (1) that does not comprise impedance converters in the power amplifier (3) layer, is hermetic, supports efficient cooling infrastructure and enables easy in-circuit applications, at least one signal divider (2) configured to send the signal to be amplified to multiple lines, and multiple power amplifiers (3) configured to amplify the signals from the signal divider (2).

The signal dividers (2) in the hybrid planar combiner (1) of the invention divide the incoming signal into the desired number by using in a structure suitable for the signal amplification target and carry the divided signal to the power amplifiers (3) formed on the same integrated plane with the shortest possible connection.

The power amplifiers (3) in the hybrid planar combiner (1) of the invention are configured to connect all signal output ends to one end of the signal combiner (4) with the shortest connection by ensuring that the signal output ends are placed closest to each other while determining their placement on the integrated plane. Thus, it is ensured that the amplified signals are transported to the point where they will be combined with minimum loss in the connection line.

The hybrid planar combiner (1) of the invention comprises a signal combiner (4), which is connected at one end to the outputs of the power amplifiers (3) and is configured to vertically separate from the substrate plane on which the integrated circuit on which the power amplifiers (3) are located is produced by combining the powers of the signals amplified by the power amplifiers (3). While determining the placements of the power amplifiers (3) on the substrate plane where the integrated circuit is manufactured, the signal output terminals are placed as closest possible to each other, and all signal output terminals are connected to one end of the signal combiner (4) with the shortest connection.

This connection scheme used ensures that the signals whose powers are combined are added to each other in the shortest way, but the output impedance $Z_0$ observed at the outputs of the identical power amplifiers (3) connected to each other is reduced to $Z_0/n$, which is equal to the quotient of n, which is the number of power amplifiers (3) whose signals are combined at the end of the signal combiner (4) vertically separated from the substrate plane where the integrated circuit on which the power amplifiers (3) are located is produced. The impedance drop in the signal combiner (4) is corrected at the input of the waveguide (not shown in the FIGURE), which will receive and transmit the amplified signal and is provided to maintain the impedance value at the desired level.

By means of the hybrid planar combiner (1) system of the invention, high loss combining circuit topologies which are placed at the outputs of power amplifiers (3) and perform the impedance matching task during the combining of the amplified signals, are avoided, the step of correcting the impedance variation against the minimum loss power combining benefit obtained by using the power amplifier (3) layout and the shortest connection to the signal combiner (4) is transferred to a single location within a environment in the form of dielectric or air-field coaxial connections, ribbon and micro-ribbon connections and waveguide (not shown in the FIGURE) which are low-loss environments. This enables the using a more efficient cooling infrastructure than in power amplifier (3) applications using spatial combiner techniques, achieving a hermetic architecture, and facilitating hermetic circuit and printed circuit board applications and rework.

What is claimed is:

1. A hybrid planar combiner configured to use multiple planar solid-state power amplifiers for use in broadband high power multi-component power amplifier architectures, the hybrid planar combiner comprising:

at least one signal divider configured to send the signal to be amplified to more than one line of the multiple planar solid-state power amplifiers;

the multiple planar solid-state power amplifiers disposed on a planar solid-state power amplifier surface and configured to amplify signals from the signal divider;

a signal combiner configured to be connected at a single common node at one end to the outputs of the power amplifiers, wherein all outputs of the power amplifiers are positioned adjacent to each other and connected to the single common node, and the signal combiner being vertically separated from the planar solid-state power amplifier surface such that the combined output is extracted vertically to the plane of the power amplifiers; and a waveguide configured to drop impedance in the signal combiner;

wherein the signal combiner is configured to ensure that an impedance value is maintained at the desired level by transferring the impedance matching to a waveguide input and wherein the output impedance $Z_0$ observed at the outputs of the identical power amplifiers connected to each other is reduced to $Z_0/n$ value by the waveguide, where the n is the number of power amplifiers.

2. The hybrid planar combiner according to claim 1, wherein the at least one signal divider is configured to divide the incoming signal into a desired number using a structure suitable for a signal amplification target and to transport the divided signal to the power amplifiers formed on a same integrated plane via the shortest connection.

3. The hybrid planar combiner according to claim 1, wherein the multiple power amplifiers are configured to connect all signal output terminals to one end of the signal combiner with the shortest connection, ensuring that the signal output terminals are located closest to each other when determining their placement in an integrated plane.

* * * * *